(12) United States Patent
Obkircher et al.

(10) Patent No.: US 9,450,570 B2
(45) Date of Patent: *Sep. 20, 2016

(54) VARIABLE FREQUENCY CIRCUIT CONTROLLER

(71) Applicant: SKYWORKS SOLUTIONS, INC., Woburn, MA (US)

(72) Inventors: Thomas Obkircher, Santa Ana, CA (US); William J. Domino, Yorba Linda, CA (US); Bipul Agarwal, Irvine, CA (US)

(73) Assignee: Skyworks Solutions, Inc., Woburn, MA (US)

( * ) Notice: Subject to any disclaimer, the term of this patent is extended or adjusted under 35 U.S.C. 154(b) by 19 days.

This patent is subject to a terminal disclaimer.

(21) Appl. No.: 14/339,910

(22) Filed: Jul. 24, 2014

(65) Prior Publication Data

US 2014/0333350 A1 Nov. 13, 2014

Related U.S. Application Data

(63) Continuation of application No. 13/427,616, filed on Mar. 22, 2012, now Pat. No. 8,823,459.

(60) Provisional application No. 61/467,501, filed on Mar. 25, 2011.

(51) Int. Cl.
*H03B 29/00* (2006.01)
*H03K 3/013* (2006.01)
*H03B 5/12* (2006.01)
*H04B 1/04* (2006.01)
*H03K 3/012* (2006.01)
*H04L 25/08* (2006.01)

(52) U.S. Cl.
CPC ............ *H03K 3/013* (2013.01); *H03B 5/1212* (2013.01); *H03B 5/1228* (2013.01); *H03B 5/1265* (2013.01); *H03B 29/00* (2013.01); *H03K 3/012* (2013.01); *H04B 1/0475* (2013.01); *H04L 25/08* (2013.01)

(58) Field of Classification Search
CPC ...... H03B 29/00; H04L 25/08; H03K 3/012; H03K 3/013
USPC ............ 331/78; 327/156, 291, 536; 341/131
See application file for complete search history.

(56) References Cited

U.S. PATENT DOCUMENTS 6,763,055 B1 * 7/2004 Fry .......................... H04B 1/04
    375/132
6,880,262 B1    4/2005 Jensen
(Continued)

FOREIGN PATENT DOCUMENTS

EP          0452031       10/1991
WO    WO 2004-092935    10/2004

OTHER PUBLICATIONS

PCT International Search Report and Written Opinion of Oct. 29, 2012, for International Application No. PCT/US2012/030200 filed Mar. 22, 2012. 13 Pages.

*Primary Examiner* — Arnold Kinkead
(74) *Attorney, Agent, or Firm* — Knobbe, Martens, Olson & Bear, LLP

(57) ABSTRACT

Apparatus and methods for distributing spurious tones through the frequency domain are disclosed. One such apparatus can include a dithering circuit configured to generate a sequence of numbers that exhibit statistical randomness and a variable frequency circuit configured to adjust a frequency of an output based on the sequence of numbers so as to spread energy of spurious tones in a frequency response of the output to lower a noise floor. In one example, spurious tones can be reduced in a negative voltage generator of a radio frequency (RF) attenuator.

20 Claims, 11 Drawing Sheets

(56) References Cited

U.S. PATENT DOCUMENTS

| | | | |
|---|---|---|---|
| 6,975,148 B2 * | 12/2005 | Miyata | H03C 3/095 327/156 |
| 7,269,200 B2 * | 9/2007 | Igarashi | H03C 3/0991 375/135 |
| 7,277,032 B2 | 10/2007 | Lin | |
| 8,269,563 B2 | 9/2012 | Ballantyne | |
| 8,823,459 B2 | 9/2014 | Obkircher et al. | |

\* cited by examiner

COMMUNICATION SYSTEM

MICROWAVE POINT-TO-POINT COMMUNICATION SYSTEM

VARIABLE FREQUENCY CIRCUIT CONTROLLER

CROSS-REFERENCE TO RELATED APPLICATIONS

This application is a continuation of U.S. patent application Ser. No. 13/427,616, filed Mar. 22, 2012, titled "VARIABLE FREQUENCY CIRCUIT CONTROLLER," which is hereby incorporated by reference herein in its entirety and which claims the benefit under 35 U.S.C. §119(e) of U.S. Provisional Patent Application No. 61/467,501, filed Mar. 25, 2011, titled "VARIABLE FREQUENCY CIRCUIT CONTROLLER," which is hereby incorporated by reference herein in its entirety.

BACKGROUND

1. Field

The disclosed technology relates to electronic systems and, in particular, to variable frequency circuits.

2. Description of the Related Art

Certain electronic systems, such as base stations, can include an attenuator to reduce an amplitude and/or power of a radio frequency (RF) signal without appreciably distorting features of the RF signal. Some attenuators can include an amplifier, a digital step attenuator (DSA), and a serial peripheral interface (SPI) controller. In some implementations, the SPI controller can convert a serial control word into an output word, which can control switches in the DSA. The bit stream can represent a time series of one or more bits. The output word can be represented as differential signals to increase performance and/or reduce power consumption. A negative voltage level can be used to generate the differential signals, for example, using a level shifter. The negative voltage can be generated by the SPI controller. For example, an oscillator can generate an output having a fixed frequency, and provide the output to a charge pump via a buffer. The charge pump can then generate the negative voltage.

Electronic systems that include attenuators can have stringent noise specifications that are difficult to meet. Conventional negative voltage generators can introduce noise in the form of spurs, which may also be referred to as "spurious tones," at harmonics of a frequency of an oscillator. Such noise can be introduced into RF inputs and/or RF outputs of some electronic systems. This can, for example, reduce noise margins. Accordingly, a need exists for reducing spurious tones in electronic systems, such as electronic systems that include attenuators.

SUMMARY OF CERTAIN INVENTIVE ASPECTS

The apparatus and methods described in the claims each have several aspects, no single one of which is solely responsible for its desirable attributes. Without limiting the scope of this invention, some prominent features will now be briefly discussed.

One aspect of the disclosure is an apparatus that includes a dithering circuit and a variable frequency circuit. The dithering circuit is configured to generate a sequence of numbers that exhibit statistical randomness. The variable frequency circuit is configured to adjust a frequency of an output based on the sequence of numbers so as to spread energy of spurious tones in a frequency response of the output to lower a noise floor.

According to certain implementations, the variable frequency circuit can include a variable oscillator configured to adjust the frequency of the output based on the sequence of numbers. In some of these implementations, the variable oscillator can be configured to adjust the frequency of the output by selectively electrically coupling one or more capacitive circuit elements to the output based on the sequence of numbers.

In accordance with various implementations, the variable frequency circuit can include a programmable frequency divider configured to adjust the frequency of the output based on the sequence of numbers.

According to a number of implementations, the dithering circuit can include a linear feedback shift register. Alternatively or additionally, a clock signal of the dithering circuit can be based on the output of the variable frequency circuit in accordance with certain implementations. For instance, the output of the variable frequency circuit can be a clock signal of the dithering circuit.

According to several implementations, the apparatus can also include a charge pump controlled based on the output of the variable frequency circuit.

The apparatus can be used in a variety of applications. For example, the apparatus can be used in a radio frequency (RF) communication system to reduce noise associated with an RF signal. As another example, the apparatus can be used in a base station to reduce noise. As another example, the apparatus can be used in a mobile device to reduce noise associated with at least one of a received signal and a transmitted signal. As another example, the apparatus can be used in a microwave point-to-point communication system to reduce noise. As yet another example, the apparatus can be used in an attenuator module to generate a negative voltage.

The sequence of numbers can be generated randomly or pseudo-randomly by the dithering circuit.

Another aspect of the disclosure is an integrated circuit that includes a controller and an attenuator component. The controller includes a negative voltage generator. The negative voltage generator has a variable frequency circuit configured to vary a frequency of an output so as to randomly or pseudo-randomly spread spurious tones through a frequency domain. The negative voltage generator also has a charge pump configured to generate a negative voltage based on the output of the variable frequency circuit. The controller is configured to generate one or more control signals. The attenuator component is configured to receive a radio frequency (RF) input and the differential pair of control signals and generate an attenuator component output based on the received signals.

According to certain implementations, the controller can further include a level shifter configured to receive the negative voltage and generate a differential pair of control signals, in which the one or more control signals generated by the controller include the differential pair of control signals generated by the level shifter.

In some implementations, the integrated circuit can also include an amplifier configured to generate an RF signal based on the attenuator output.

According to certain implementations, the controller can further include control circuitry configured to generate one or more control words based on control data and provide the one or more control words to the level shifter. Alternatively or additionally, the controller can further include a dithering circuit configured to generate a pseudo-random bit stream, and the frequency of the output of the variable frequency circuit can be based on the pseudo-random bit stream. In accordance with various implementations, the controller can be a serial peripheral interface controller.

In a number of implementations, the attenuator component can be a digital step attenuator component.

Another aspect of the disclosure is an electronic system that includes an antenna, a baseband processor configured to process baseband signals, and a transceiver in operative communication with the antenna and the baseband processor. The transceiver is configured to generate a bit stream that exhibits statistical randomness and vary a frequency of a variable frequency signal based on the bit stream so as to distribute spurious tones in a frequency domain of the variable frequency signal.

In some implementations, the transceiver can include a transmit path configured to receive data from the baseband processor, generate the variable frequency signal, and transmit a radio frequency (RF) signal via the antenna. Alternatively or additionally, the transceiver can include a receive path configured to receive an RF signal from the antenna, generate the variable frequency signal, and provide receive data to the baseband processor.

In accordance with certain implementations, the electronic system can be a base station.

Another aspect of the disclosure is a method that includes receiving a sequence of numbers that exhibit statistical randomness, and distributing spurious tones through a frequency domain of a signal based on the sequence of numbers.

In some implementations, the method further includes generating the sequence of numbers. According to a number of implementations, distributing includes adjusting a frequency of the signal based on the sequence of numbers. In accordance with several implementations, the method further includes generating a negative voltage based on the signal. In a number of implementations, the signal can be a radio frequency signal.

Yet another aspect of this disclosure is an apparatus that includes means for generating a pseudo-random bit stream, and means for spreading the energy of spurious tones in a frequency response of a signal based on the pseudo-random bit stream.

According to some implementations, the means for spreading energy can include a variable oscillator configured to adjust the frequency of the signal based on the pseudo-random bit stream. In certain implementations, the means for spreading energy can include a programmable frequency divider configured to adjust the frequency of the output based on the pseudo-random bit stream. In accordance with various implementations, a clock signal of the means for generating the pseudo-random bit stream is based on a signal generated by the means for spreading energy.

For purposes of summarizing the disclosure, certain aspects, advantages and novel features of the inventions have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

DETAILED DESCRIPTION OF CERTAIN EMBODIMENTS

Figure 1:
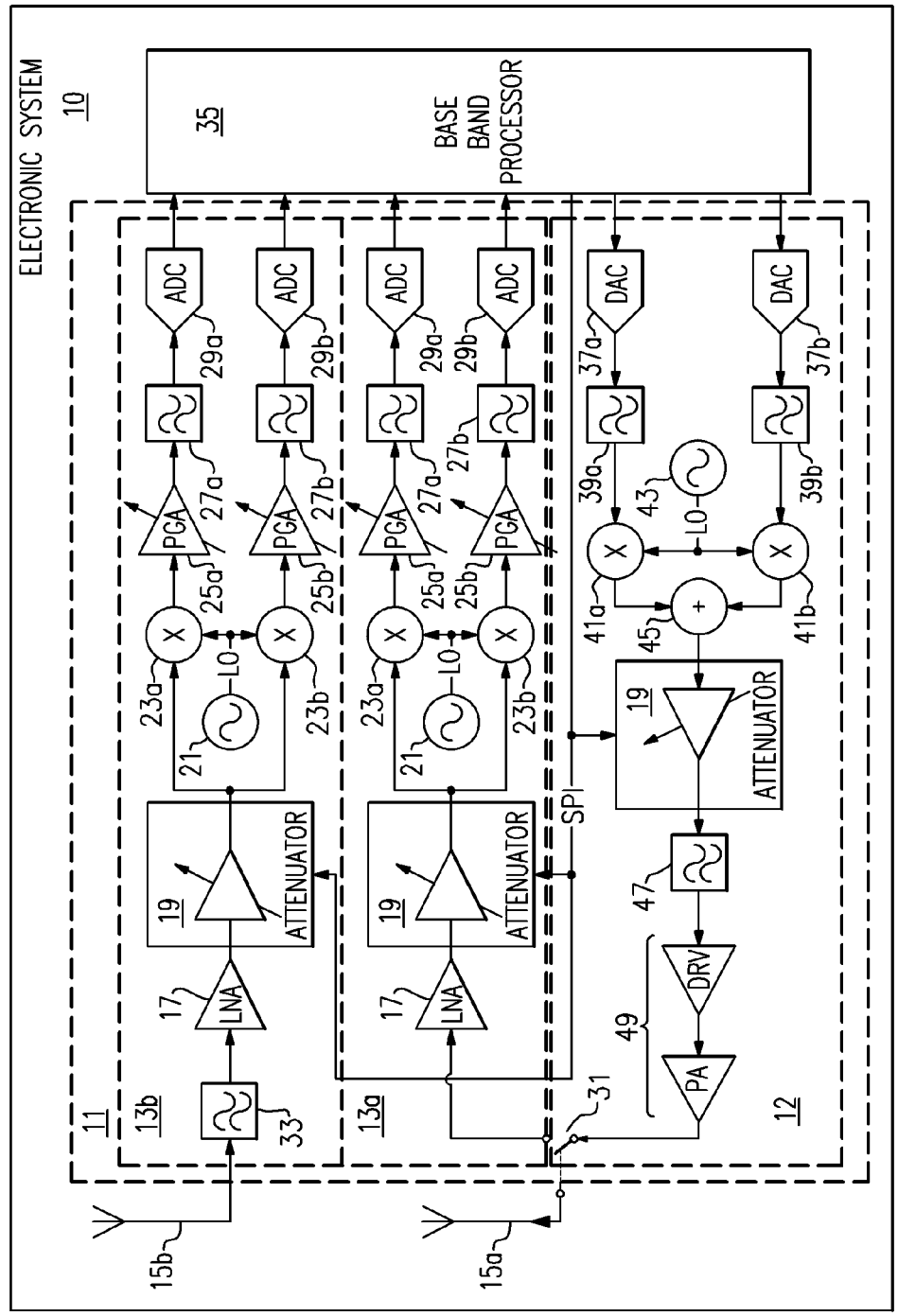
FIG. 1 schematically depicts an illustrative electronic system that includes a radio frequency (RF) attenuator.

Generally described, aspects of the present disclosure relate to reducing spurious tones on an output of an oscillator and/or another circuit configured to generate a high frequency signal. According to aspects of this disclosure, spurious tones can be reduced in an output of a variable frequency circuit, which can include, for example, a variable oscillator or a variable frequency divider. In some implementations, a variable frequency circuit may be part of a negative voltage generator. The negative voltage generator may be included in an attenuator, for example, in a base station, access point, or a radio frequency (RF) repeater system. Spurious tones can occur at a harmonic of a frequency of the output of an oscillator in the variable frequency circuit. The spurious tones can add unwanted noise to a negative voltage that can be used, for example, to generate differential control signals for the attenuator. Noise from the spurious tones can consume part of a noise tolerance, which is stringent in certain applications. In some implementations, spurious tones can cause the attenuator to fail a noise specification, which can, in some cases, result in functional failures.

According to the apparatus and methods described herein, noise from spurious tones of an oscillator can be spread randomly or pseudo-randomly though the frequency domain, thereby lowering a noise floor of spurious tones of a frequency response of a signal, such as the negative voltage generator output. This can be achieved, for example, using a variable oscillator controlled by a dithering circuit. The dithering circuit can generate a sequence of numbers that exhibit statistical randomness. For instance, the dithering circuit can generate a pseudo-random bit stream of one or more bits, or any suitable pseudo-random voltage, to dynamically adjust frequency of the variable oscillator. A random bit stream can be used in place of the pseudo-random bit stream in accordance with any of the principles and advantages described herein. In some implementations, the dithering circuit can include a linear feedback shift register. The pseudo-random bit stream can be used to selectively electrically couple one or more capacitive elements in parallel and/or in series with a capacitance of the variable oscillator. A frequency of an output of the variable oscillator can be adjusted based on how much capacitance is in parallel and/or in series with the capacitance of the variable oscillator. The dithering circuit can cause the frequency of the variable oscillator to be adjusted in a pseudo-random fashion. This can randomize the spurious tones associated with harmonics of an output of the variable oscillator through the frequency domain. In certain implementations, the dithering circuit can use an output of the variable oscillator as a clock signal. This can add another layer of randomness to varying the frequency of the variable oscillator.

The apparatus and methods described herein may be able to achieve one or more of the following advantageous features, among others. First, a noise floor of signal, such as an output of a negative voltage generator, can be reduced. Second, spurious tones in a signal, such as a negative voltage signal, can be reduced with little or no increase in physical circuit area. Third, noise problems can be addressed at or near the source instead of filtering downstream, which can consume additional area for filters and/or special pad placement with substrate isolation. Fourth, signal integrity can be maintained without lowering a control voltage level. Although this disclosure may describe features in the context of a negative voltage generator and/or an attenuator, any of the principals and advantages described herein can be applied to any variable frequency circuit with a need for reducing spurious tones.

Any of the principles and advantages herein can be applied to a wide variety of applications in which spurious tones can advantageously be reduced, for example, in a base station, an access point, or a RF repeater system. FIG. 1 schematically depicts an illustrative electronic system 10 that includes a radio frequency (RF) attenuator. The electronic system 10 can be, for example, a base station.

The electronic system 10 can be used for transmitting and/or receiving RF signals using a variety of communication standards, including, for example, Global System for Mobile Communications (GSM), Code Division Multiple Access (CDMA), Bluetooth, ISA100.11a, IEEE 802.15.4, and/or Wireless HART, as well as other proprietary and non-proprietary Gaussian frequency-shift keying (GFSK) and frequency-shift keying (FSK) based schemes, including multi-level FSK schemes, such as 4FSK.

The electronic system 10 can include a transceiver component 11 configured to generate RF signals for transmission via an antenna 15a, and to receive incoming RF signals from an antenna 15a, 15b. The transceiver component 11 can include one or more transmit paths 12 and one or more receive paths 13a, 13b. The transceiver component 11 can include one or more attenuators 19, which can include negative voltage generators.

A receive path 13a, 13b can include, for example, one or more of the following components: a low noise amplifier 17, an attenuator 19, an oscillator 21, a first mixer 23a, a second mixer 23b, a first programmable gain amplifier 25a, a second programmable gain amplifier 25b, a first filter 27a, a second filter 27b, a first analog-to-digital converter 29a, and a second analog-to-digital converter 29b.

An RF signal can be received at the antenna 15a, 15b. The receive path 13a can provide an input voltage to the low noise amplifier 17 via a switch 31, for example, when the antenna 15a that is also selectively coupled to the transmit path 12 is not used for transmitting one or more signals. Alternatively or additionally, the receive path 13b can filter the RF signal provided by the antenna with an input filter 33.

The input filter 33 can be a low pass filter, a band pass filter, or a high pass filter, depending on the application.

The low noise amplifier 17 can include an input for receiving an input voltage. The input voltage can be an RF signal. For example, the electronic system 10 can receive a packet from a transmitter transmitting over the RF, UHF, VHF, and/or ISM frequency bands at a distance of up to several kilometers. Thus, the carrier frequency of the input voltage can be of a variety of values, including, but not limited to, a carrier frequency ranging between about 400 MHz to about 3 GHz.

The input voltage received by the low noise amplifier 17 can have a relatively small magnitude. The low noise amplifier 17 can be configured to amplify the signal, while adding a relatively small amount of noise. The low noise amplifier 17 can then provide an output to an attenuator 19, which can include a digital step attenuator. The attenuator 19 can reduce the amplitude of the low noise amplifier output without appreciably distorting features of the low noise amplifier output. The attenuator 19 can also provide a variable gain. For example, a control input can be used to adjust the gain. An attenuator 19 can be used to reduce the amplitude of a signal before demodulating the signal, in some implementations. The attenuator 19 can receive a control input form the baseband processor 35, for example, to adjust the gain. More details regarding attenuators will be provided later.

The first and second mixers 23a, 23b can be configured to receive first and second local oscillator clock signals from the local oscillator 21. The first and second local oscillator clock signals can have about the same frequency and a phase difference equal to approximately a quarter of a period, or about 90°. The first and second mixers 23a, 23b can be configured to down convert the output of the attenuator 19 using the first and second local oscillator clock signals, respectively, thereby generating first and second demodulated signals. The first and second demodulated signals can have a relative phase difference of approximately a quarter of a period, or about 90°. In some embodiments, the first and second demodulated signals can be used in a Q path and an I path. In one embodiment, one of the first or second oscillator clock signals is generated by phase shifting from the other.

The first and second local oscillator clock signals can each have a frequency selected so as to achieve a desired intermediate frequency and/or baseband frequency for the first and second demodulated signals. For example, multiplying the amplified input signal by a sinusoidal signal from the oscillator can produce a mixed signal having a frequency content centered about the sum and difference frequencies of the carrier frequency of the attenuator output signal and the frequency of the local oscillator 21.

The first demodulated signal can be amplified, for example, with a programmable gain amplifier 25a, 25b. Then the output of the programmable gain amplifier 25a, 25b can be filtered with any suitable filter 27a, 27b (for example, a low pass, band pass, or high pass filter). The output of the filter can be provided to an analog-to-digital converter 29a, 29b. The analog-to-digital converter 29a, 29b can digitize an input to any suitable resolution. For instance, the analog-to-digital converter 29a, 29b can be a 1-bit analog-to-digital converter, such as a limiter or a saturated analog-to-digital converter, and the output can be a one-bit digital signal. The digital to analog converter 29a, 29b can convert an analog input to a digital output and provide the digital output to the baseband processor 35 for further processing. In this way, analog signals in the receive path 13a, 13b can be processed by the baseband processor 35. The second demodulated signal can be processed with separate and substantially similar components as the first demodulated signal so a digital signal corresponding to the second demodulated signal can also be provided to the baseband processor 35.

The baseband processor 35 can be any suitable processor configured to process a baseband signal. For instance, the baseband processor 35 can include a digital signal processor, a microprocessor, a programmable core, the like, or any combination thereof. Moreover, in some implementations, two or more baseband processors 35 can be included in the electronic system 10.

A transmit path 12 can receive data from the baseband processor 35 and cause the received data to be transmitted as an RF signal via an antenna 15a. In some implementations, a transmit path 12 can transmit the RF signal via an antenna 15a also used by a receive path 13a. In other implementations, a transmit path 12 can transmit the RF signal via an antenna that is not shared with a receive path. Similarly, in some implementations, a receive path 13b can receive an RF signal from antenna 15b that is not shared with a transmit path 12. A transmit path 12 can include, for example, one or more of the following components: a first and second digital-to-analog converters 37a, 37b, first and second filters 39a, 39b, first and second mixers 41a, 41b, a local oscillator 43, a combiner 45, an attenuator 19, an output filter 47, and a power amplifier 49.

The baseband processor 35 can output a signal for a Q path and a signal for an I path. Each of these signals can be processed substantially the same in parallel with separate hardware until they are combined. The digital-to-analog converter 37a, 37b can receive a digital signal from the baseband processor 35 and convert the digital signal to an analog signal. The digital-to-analog converter 37a, 37b can have any suitable precision. The output of the digital-to-analog converter 37a, 37b can be filtered via the first or second filters 39a, 39b before being up converted using a mixer 41a, 41b clocked by an output of the local oscillator 43. The mixer 41a, 41b can convert a baseband input to RF.

Signals from the Q path and the I path can be combined via the combiner 45 so that they can be transmitted in a single RF signal. An output of the combiner 45 can be provided to the attenuator 19, which can include a digital step attenuator. The attenuator 19 can have a variable gain. For example, the gain of the attenuator 19 can be controlled based on one or more control signals provided by the baseband processor 35. More details regarding attenuators will be provided later, for example, with reference to FIG. 2.

The output of the attenuator 19 can be filtered. For example, a low pass, band pass, or high pass filter can filter the output of the attenuator 19. This can, for example, remove noise and/or unwanted frequency bands. An output of the output filter 47 can be amplified by a power amplifier 49. The power amplifier 49 can have two or more stages in some implementations. The power amplifier 49 can provide an amplified RF signal to the antenna 15a for transmission from the electronic system 10. In some implementations, the RF signal is provided to the antenna 15a via a switch 31.

Figure 2:
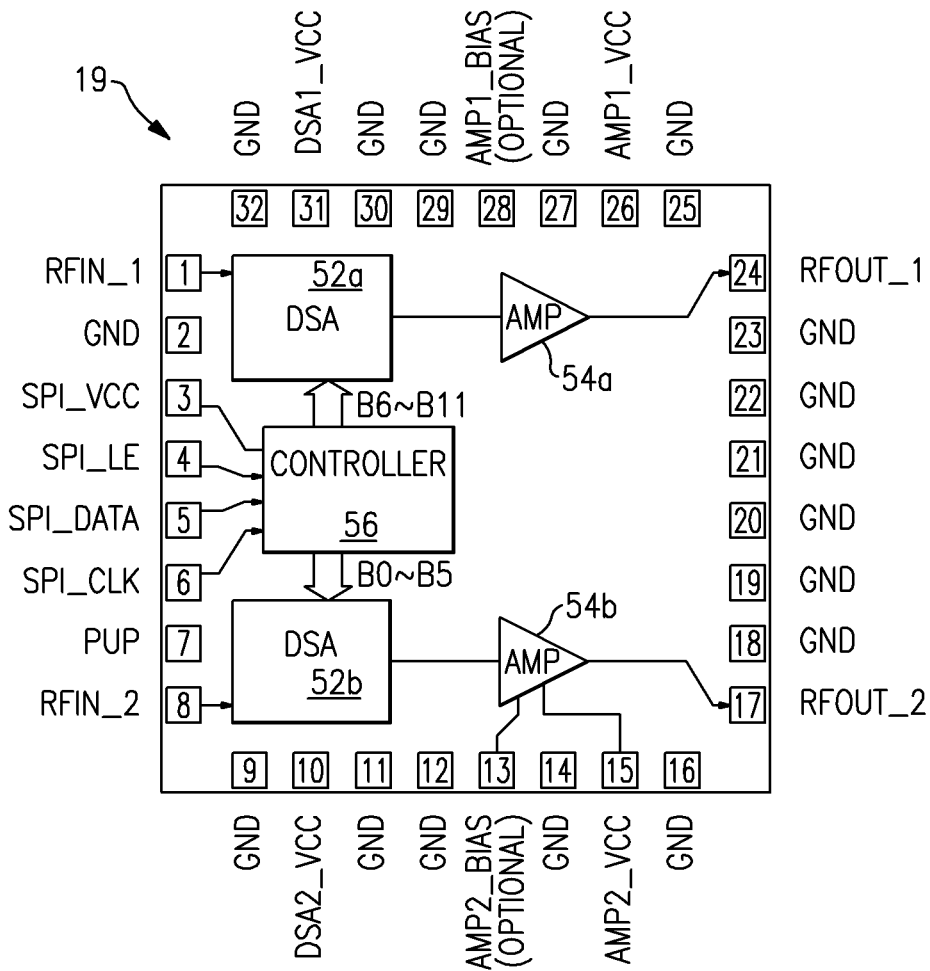
FIG. 2 schematically depicts an illustrative RF attenuator.

Referring to FIG. 2, an illustrative attenuator 19 will be described. As shown in FIG. 2, the attenuator 19 is an RF attenuator module. The RF attenuator module can be implemented on a single integrated circuit in some implementations. The RF attenuator module can be implemented on two or more integrated circuits in other implementations. An integrated circuit that includes the attenuator 19 can be encased within a package and have a plurality of pins for receiving various input signals and providing various output signals. For example, as illustrated in FIG. 2, the integrated circuit including the attenuator 19 can have 32 leads for receiving control signal(s), data signal(s), ground, power, or any combination thereof. The pins can receive analog and/or digital input signals. Further, some pins can be specifically configured to receive RF signals. In addition, the pins can provide output signals, such as RF signals, for use with other integrated circuits.

The attenuator 19 can include one or more digital step attenuator (DSA) components 52a, 52b, one or more RF amplifiers 54a, 54b, and a controller 56, which can be a serial peripheral interface (SPI) controller is some implementations. A digital step attenuator component 52a, 52b can reduce the amplitude of an RF input signal RFIN_1, RFIN_2 without appreciably distorting the features of the RF input signal. The digital step attenuator component 52a, 52b can be controlled by the controller 56, such as an SPI controller, to be enabled/disabled and/or to adjust a gain of the RF input signal. The output of the digital step attenuator component 52a, 52b can be amplified by an amplifier 54a, 54b. The amplifier 54a, 54b can be any suitable amplifier configured to amplify an RF signal. The amplifier 54a, 54b can have any suitable gain for a desired application. The gain can be controlled, for example, by a bias voltage AMP1_BIAS, AMP2_BIAS and/or a supply voltage AMP1_VCC, AMP2_VCC provided to the amplifier 54a, 54b. The output of the amplifier can be provided as an RF output signal RFOUT_1, RFOUT_2 of the attenuator 19. The RF output signal can be used in a transmit path or receive path, for example, as described earlier with reference to FIG. 1.

The illustrated controller 56 can convert a serial control word into one or more output words that can control switches, or other circuit elements, in the DSA component 52a, 52b. For example, the controller 56 can generate a pair of parallel words of any suitable number of bits (for example, 6 bits per word) in certain implementations. In this example, one word can control the first DSA component 52a and the other word can control the DSA component 52b. Each bit in each control word can be represented as a complementary signal. A complementary pair of signals can include a first signal with a logic value of "1" (or "0") and a second signal with a complementary logic value of "0" (or "1"). The logic "1" may be implemented as a positive voltage while the logic "0" may be implemented as a zero voltage (for example, ground). Such a pair of complementary signals can be used for controlling a stage of attenuation in a DSA component, because such control can include turning on one transistor in the DSA component while simultaneously turning off another transistor in the DSA component. Further, the DSA component performance can be improved by representing the logic "0" signal with a negative voltage instead of a zero voltage. In this case, the complementary pair of control signals becomes a differential pair of control signals. The DSA component performance can be improved with the differential control signals, for example, because the transistor in the DSA component that is turned off is forced further into its off region by the negative voltage. The controller 56 can generate the negative voltage, for example, using level shifters to convert one or more single-ended control lines into one or more differential pairs.

Figure 3:
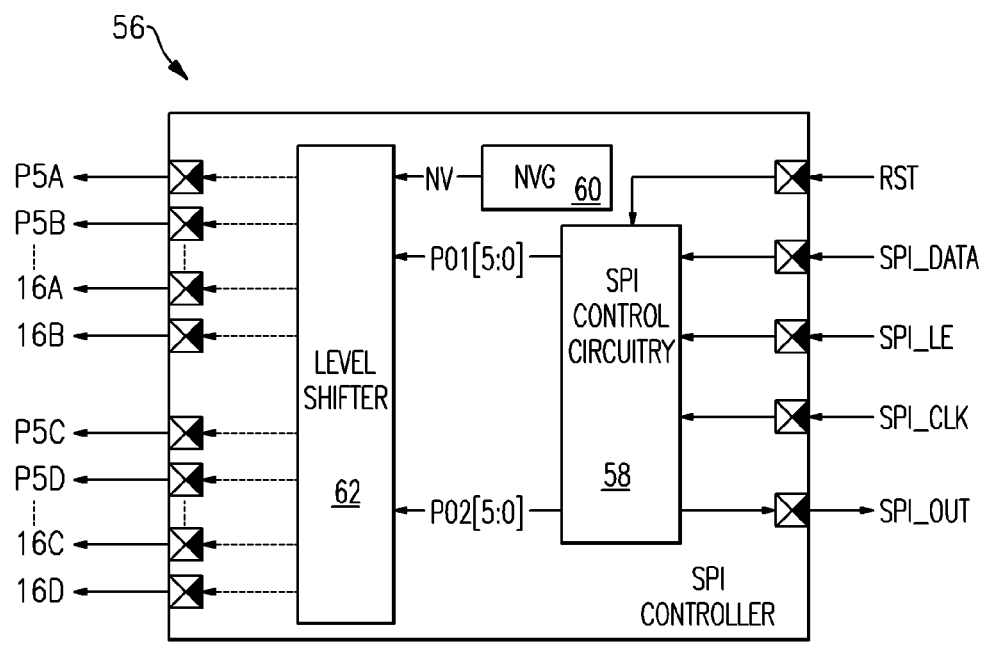
FIG. 3 schematically depicts an illustrative controller with a negative voltage generator.

Referring to FIG. 3, more detail will be provided about an illustrative controller 56. The controller 56 can include a SPI control circuitry 58, a negative voltage generator 60, and a level shifter 62. The SPI control circuitry 58 can receive SPI data SPI_DATA, a clock SPI_CLK, a latch enable SPI_LE, and a reset signal RST. The illustrated SPI control circuitry 58 can generate two output words PO1[5:0] and P02[5:0] from a serial bit stream of SPI data SPI_DATA. The output words can be provided to the level shifter 62.

The negative voltage generator 60 can generate a negative voltage NV and provide the negative voltage NV to the level shifter 62. The level shifter 62 can use the negative voltage NV to generate differential control signals corresponding to the two output words received from the SPI control circuitry 58. The differential control signals can control an attenuator component, such as the DSA component 52a, 52b. Using differential control signals can increase performance and/or reduce power consumption.

The negative voltage generator 60 can include an oscillator and a charge pump to control the negative voltage NV and/or switching time. The overall system, or any subsystem thereof, may have stringent noise specifications. However, the circuit topology of some conventional negative voltage generators can introduce unwanted noise and/or spurious tones into the system. For example, negative voltage generators with a fixed oscillator frequency have created spurious tones on the negative voltage generated. A spurious tone or plurality of spurious tones can represent an unwanted noise component of a signal.

Figure 4:
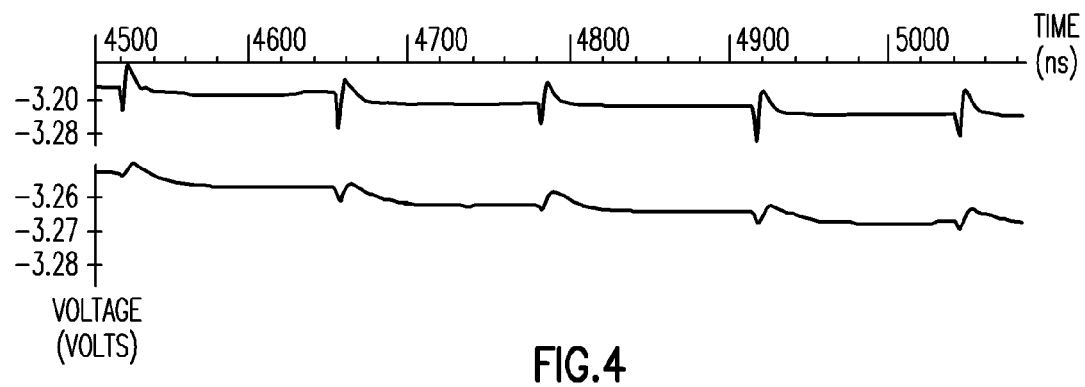
FIG. 4 graphically illustrates ripples on signals in the time domain that are introduced by a fixed oscillator.

FIG. 4 illustrates ripples in the time domain that correspond to spurious tones in the frequency domain. FIG. 4 graphically illustrates ripples from a negative voltage generator with fixed oscillator in the time domain. The recurring ripples on the graph of voltage over time in FIG. 4 can produce the unwanted spurious tones in the frequency domain, as will be described later. These ripples can result from coupling of a fixed oscillator that generates a signal of a fixed frequency. The top waveform illustrated in FIG. 4 shows ripples on a negative voltage signal at the output of the negative voltage generator. These ripples are then coupled to the differential output signals of a level shifter. Ripples on the level shifter output are shown in the bottom waveform of FIG. 4. These ripples can further couple onto the RF signal that passes through the DSA component, resulting in unwanted noise components on an RF output signal.

Figure 5:
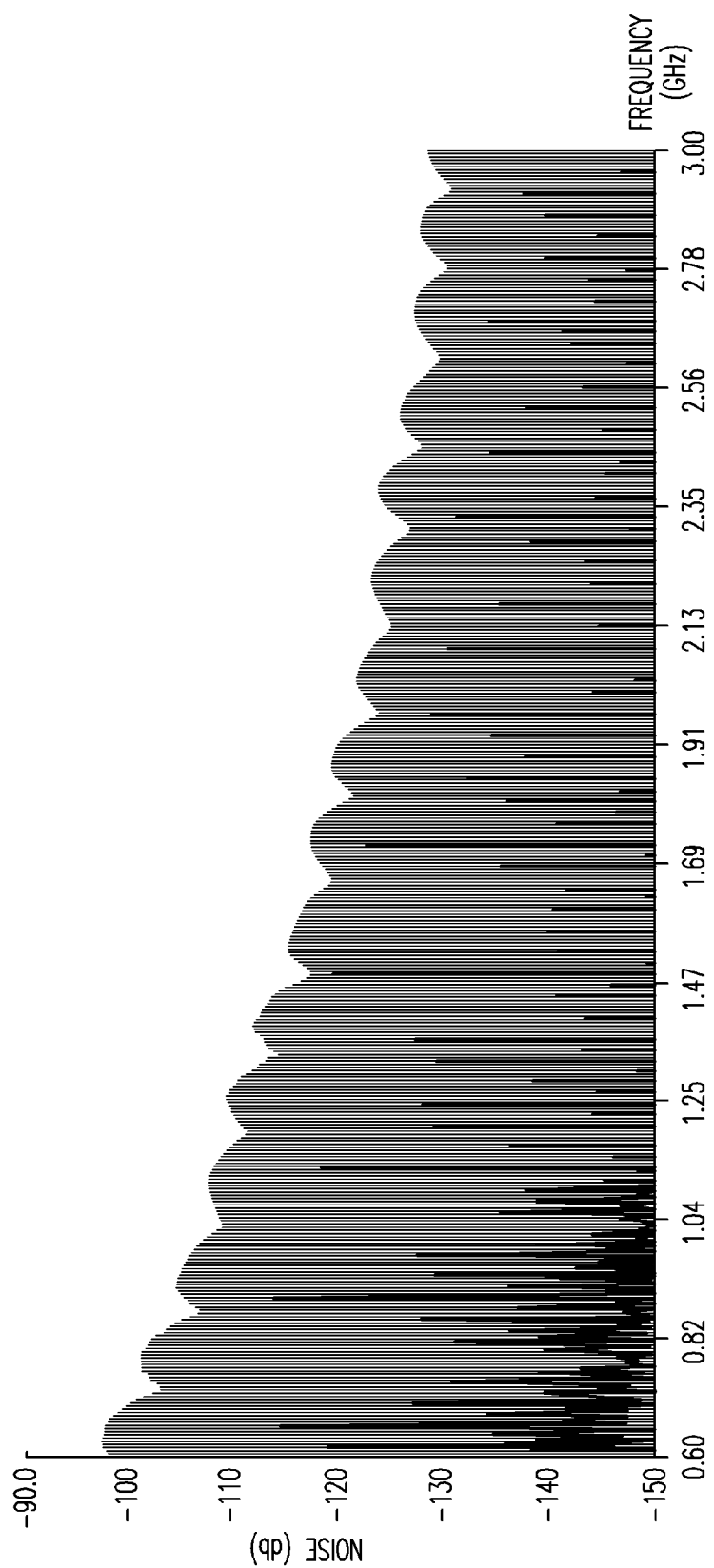
FIG. 5 graphically illustrates a frequency response of a negative voltage signal generated by the fixed oscillator in an RF frequency band.

The ripples shown in FIG. 4 occur in time, at a rate that can be approximately equal to a fixed frequency used to generate the negative voltage. FIG. 5 graphically illustrates the same negative voltage signal in the frequency domain, in which a large number of harmonics can be seen. These harmonics are multiples of the fixed frequency used to generate the negative voltage. The order of these harmonics can extend relatively high, for example, into the hundreds. As a result, the frequency of these harmonics can reach as high as a few GHz or more. These harmonics can extend into the RF band, overlapping the same frequency region as the RF signal that is passed through the DSA component. When these harmonics couple from the level shifter to the DSA component, they can add to the RF signal passed through the DSA component, appearing as added noise. In some applications, noise on an RF signal ranging from about −130 dB to −140 dB is considered to be within an acceptable range. However, as shown in FIG. 5, the noise is above −130 dB for substantially the entire RF frequency band. Thus, the circuit corresponding to FIG. 5 does not have a comfortable noise margin. In some instances, this may lead to failing system noise specifications.

As shown in FIGS. 4 and 5, spurious tones on the negative voltage can propagate through to an RF output signal. For example, spurious tones on the negative voltage NV can couple to the differential output words of the level shifter 62. The spurious tones on the differential output words can also introduce unwanted noise through one or more switches of the digital step attenuator component 52a, 52b to the RF output RFOUT_1 and/or RFOUT_2 of the attenuator 19. As a result, overall noise performance can be degraded. The spurious tones can reduce a dynamic range, reduce a signal to noise ratio, reduce a noise margin, the like, or any combination thereof. These effects can increase the likelihood of functional errors, increase sensitivity to noise on input signals, degrade RF output signals and/or degrade RF signals received from the system, the like, or any combination thereof. In some instances, spurious tones introduced by a fixed oscillator in a negative voltage generator can cause a system to fail a noise figure specification.

Figure 6:
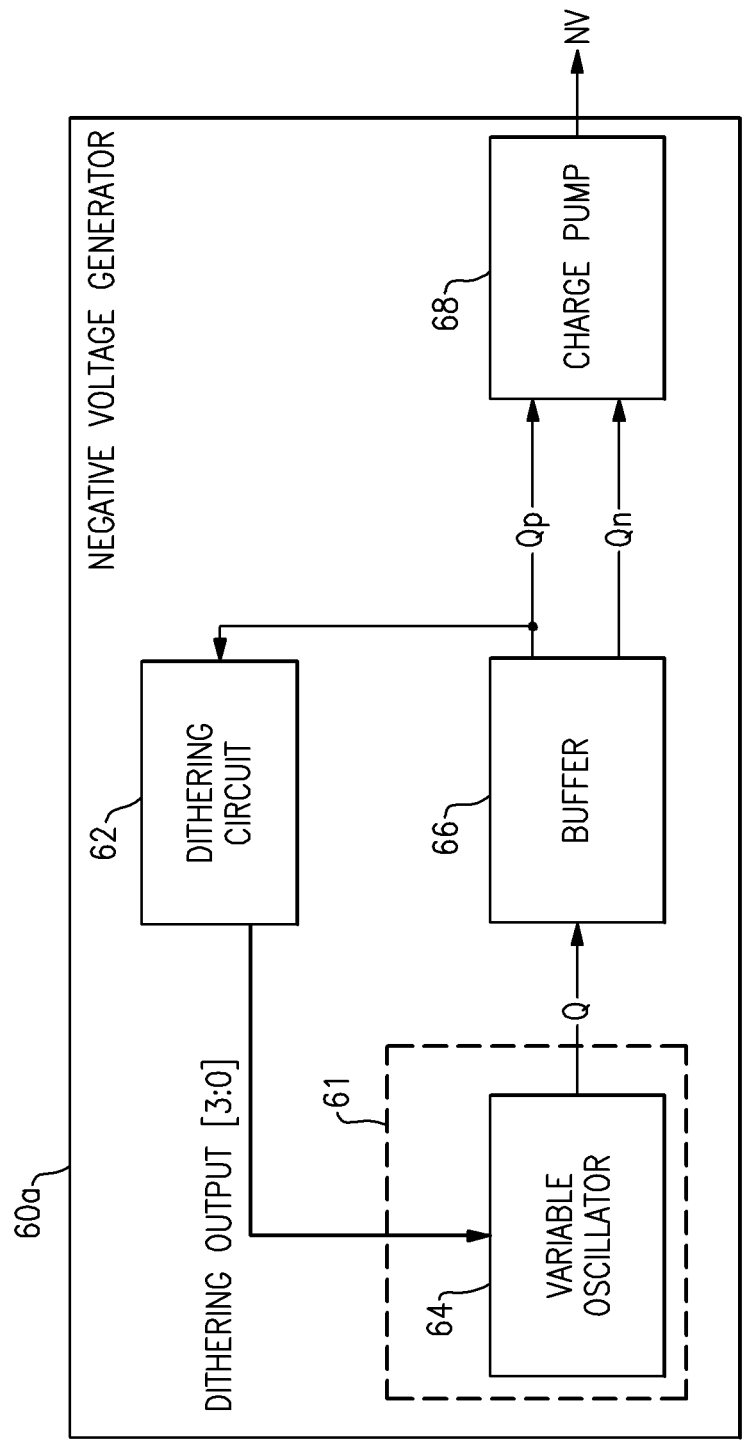
FIG. 6 schematically illustrates a negative voltage generator according to an embodiment.

FIG. 6 schematically illustrates a negative voltage generator 60a according to an embodiment. The negative voltage generator 60a can be implemented in any part with a need for a negative voltage. For example, any negative voltage generator described herein can be implemented in the attenuator 19, other variable attenuators in a receive chain of a Receive Tower Top Amplifier (TTA), or in a bias controller for RF switches which use D-Mode pHEMT field effect transistors. The negative voltage generator 60a can implement a dynamic approach to spreading noise energy from a variable frequency circuit, such as a variable oscillator, so as to lower a noise floor of spurious tones on harmonics of the negative voltage ripples. The negative voltage generator 60a can spread noise energy by controlling a variable frequency circuit 61 with a dithering circuit 62. In the negative voltage generator 60a illustrated in FIG. 6, the variable frequency circuit 61 includes a variable oscillator 64. In addition to the variable frequency circuit 61 and the dithering circuit 62, the negative voltage generator 60a can include a buffer 66 and a charge pump 68.

The dithering circuit 62 can generate a pseudo-random number in the form of a bit stream based on an output Q of the variable frequency circuit 61. The pseudo-random bit stream may be provided as an output of the dithering circuit 62. The bit stream generated by the dithering circuit 62 can be referred to as pseudo-random because the bit stream may appear random, although the bit stream is generated by a deterministic causal process. The pseudo-random bit stream exhibits statistical randomness. Yet, the pseudo-random bit stream generated by the dithering circuit 62 can be represented by a logic function.

As shown in FIG. 6, the output Q of the variable frequency circuit 61 can be buffered by a buffer 66 and then a buffered output Qp can be provided to the dithering circuit 62. In some implementations, a clock signal of the dithering circuit 62 can be based on the output of the variable frequency circuit 61. This can add a second level of randomness to the pseudo-random bit stream generated by the dithering circuit 62 because a frequency of the clock should vary as a frequency of the output Q of the variable frequency circuit 61 is adjusted.

Figure 7:
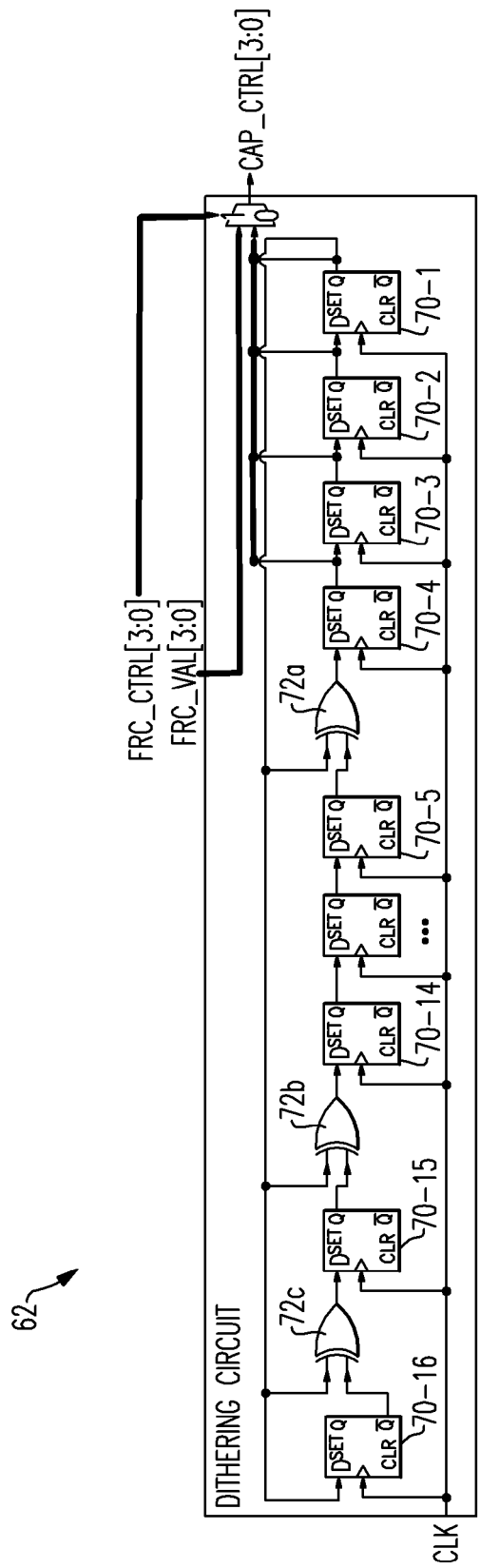
FIG. 7 schematically illustrates a dithering circuit according to an embodiment.

Referring to FIG. 7, an illustrative dithering circuit 62 will be described. The dithering circuit 62 can be implemented using any suitable combination of analog and digital circuit elements. In some implementations, the dithering circuit 62 can be implemented using digital logic. The dithering circuit 62 can include a linear feedback shift register (LFSR). The length of the LFSR in bits can be selected, for example, based on a desired level of randomness in the output of the dithering circuit 62. The LFSR can include a plurality of state elements 70, such as flip-flops, latches, the like, or any combination thereof. One state element 70 can implement each bit of the LFSR. For example, as illustrated in FIG. 7, the dithering circuit 62 includes a 16-bit LFSR and 16 flip-flops are included.

To vary the bit stream generated by the LFSR, logic circuits can be included between one or more state elements. The logic circuits can receive outputs from two or more state elements and implement any suitable logic function (for example, NAND, NOR, NOT, XOR, the like, or any combination thereof). For example, in the illustrated dithering circuit 62, XOR gates 72a, 72b, 72c are implemented between some of the state elements 70. More specifically, in the illustrated dithering circuit 62, XOR gate 72a is implemented between the $4^{th}$ and $5^{th}$ state elements 70-4 and 70-5, respectively, XOR gate 72b is implemented between the $14^{th}$ and $15^{th}$ state elements 70-14 and 70-15, respectively, and XOR gate 72c is implemented between the $15^{th}$ and $16^{th}$ state elements 70-15 and 70-16, respectively. XOR gates may be used for one or more logic circuits between state elements for the mathematical properties of the XOR logic function. In some implementations, different logic circuits can be included between different state elements. In other implementations, the same logic circuits (for example, XOR gates) can be implemented between state elements, for example, as shown in FIG. 7. In any of these implementations, some state elements may provide an output to the input of the next state element in the LFSR without passing through a logic circuit. For example, there are no logic circuits implemented between the $5^{th}$ to $14^{th}$ state elements 70-5 to 70-14, respectively, and the $1^{st}$ to $4^{th}$ state elements 70-1 to 70-4, respectively. In this example, the Q output of one state element can be provided to the D input of an adjacent state element.

The length in bits of the LFSR and/or the placement of XOR gates, which can be referred to as a "feedback path polynomial," can impact the pseudo-random sequence of bits generated by the dithering circuit 62. As a result, the length of the LFSR and/or the placement of XOR gates can also impact how the variable oscillator is controlled. Adjusting the frequency of the variable oscillator 64 (for example, via dynamic switching) can affect a spur level and resulting harmonics in the frequency spectrum of an output of the variable oscillator 64 and/or other signals in the data path, such as the negative voltage signal and the RF output of the DSA 19. In some implementations, the LFSR length and/or the feedback path polynomial can be programmable to tune and/or optimize the spreading of unwanted spurious tones. This can allow the LFSR and/or the feedback path polynomial to be adjusted based on a desired frequency range of operation or other parameters.

The logic circuits can be configured to receive one or more inputs from any of the state elements in the LFSR. For example, in the illustrated dithering circuit 62, the logic circuits receive each one input from the output of one state element (i.e., the $1^{st}$ state element 70-1) and another input from a different state element (i.e., the $16^{th}$, $15^{th}$, or $5^{th}$ state elements 70-16, 70-15, or 70-5, respectively). In this way, the bit stream generated by the illustrated dithering circuit 62 can be pseudo-random.

In certain implementations, the clock signal CLK can be a buffered version of an output from the variable frequency circuit 61 (for example, an output of the variable oscillator 64). Because the output of the variable frequency circuit 61 changes in frequency, the frequency of the clock signal CLK can also change. With an adjusted frequency, the clock signal CLK can add additional randomness to the bit stream generated by the dithering circuit. More specifically, the data stored by one or more state elements can be different based on the clock signal CLK capturing data at different points in time due to the adjusted frequency.

The pseudo-random bit stream generated by the dithering circuit 62 can control the frequency of the variable frequency circuit 61. For example, when the variable frequency circuit 61 includes a variable oscillator 64, the pseudo-random bit stream can be used to adjust the frequency the variable oscillator 64.

The pseudo-random bit stream can include any suitable number of bits. For example, the pseudo-random bit stream can range from about 1 to 16 bits. For example, as illustrated in FIGS. 6 and 7, the pseudo-random bit stream can be four bits. The number of bits can depend on the number of bits used to control the variable frequency circuit 61 and/or a desired precision of a frequency of an output of the variable frequency circuit 61.

In addition to generating the pseudo-random bit stream, the dithering circuit 62 can tune the output bit stream with the two control words FRC_VAL[3:0] and FRC_CTRL[3:0], according to certain implementations. These control words can control a number of bits and/or a range of frequencies over which dithering occurs. For instance, a fixed frequency (for example, a lower frequency) can be selected using the control words. A first control word can provide an output word FRC_VAL[3:0] that can output instead of the pseudo-random bit stream. The first control word can be used to select the frequency of the output word. A second control word FRC_CTRL[3:0] can be used to select whether to provide the pseudo-random bit stream or the first control word as the output of the dithering circuit 62. For example, the second control word can be a select input to a multiplexer configured to select between the pseudo-random bit stream or the first control word. In some implementations, the second control word can be one bit to select either the pseudo-random bit stream or the control word. In other implementations, the second control word can select any number of bits (for example, each bit can be selected) between outputting bits of the pseudo-random bit stream or bits of the first control word. Any portion of the first control word and/or the second control word can be controlled via software and/or hardware.

Referring back to FIG. 6, the output of the dithering circuit 62 can control the frequency of the variable frequency circuit 61. The variable frequency circuit 61 can be any circuit configured to generate an output having a frequency that is adjustable based on the output of the dithering circuit. In some implementations, the variable frequency circuit 61 can include a variable oscillator 64.

Figure 8:
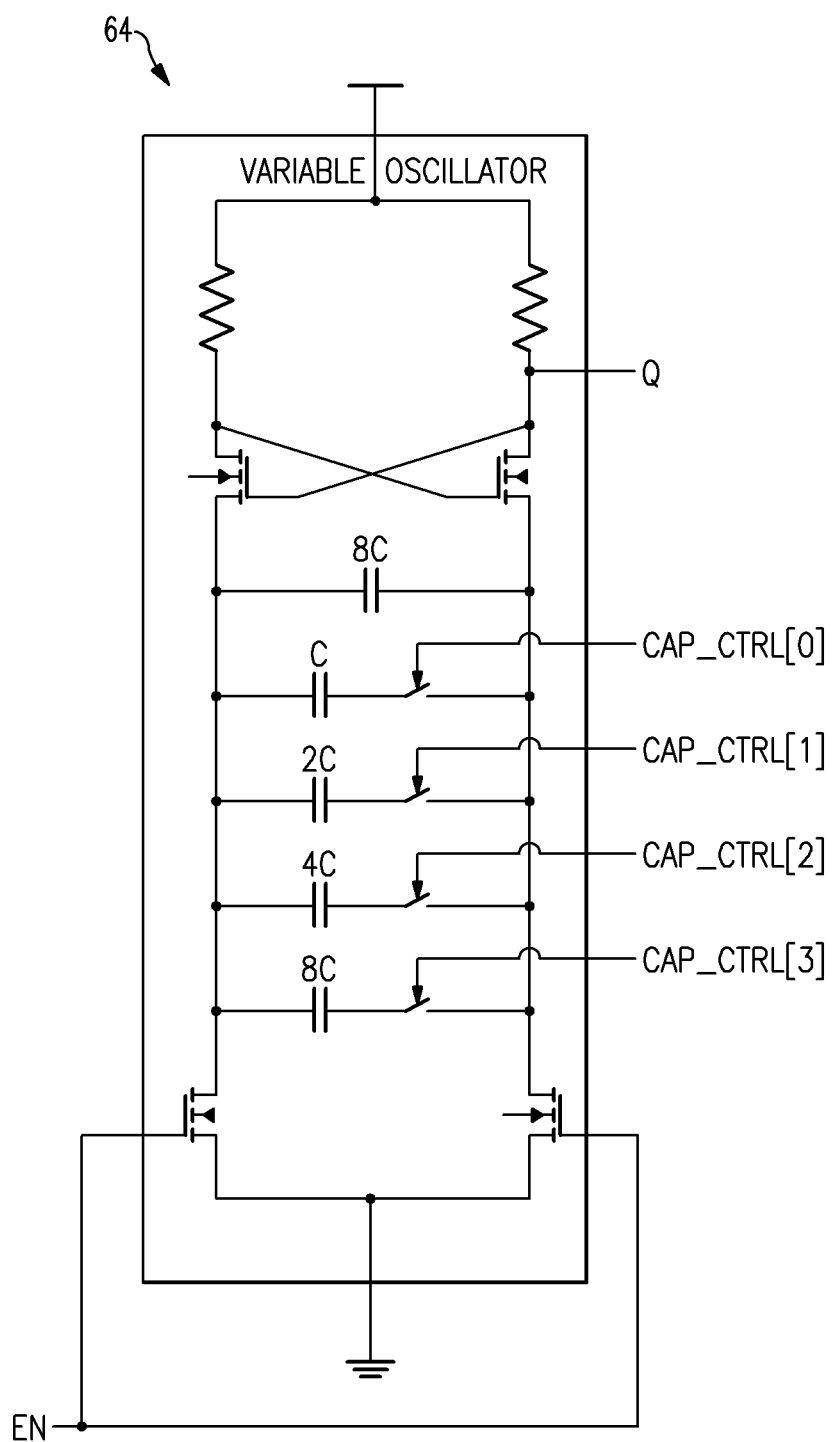
FIG. 8 schematically depicts an illustrative variable oscillator.

Referring to FIG. 8, an illustrative variable oscillator 64 will be described. The output word from the dithering circuit 62 can be used to selectively couple one or more capacitive circuit elements in series and/or parallel with a capacitance of the variable oscillator 64. As illustrated in FIG. 8, the variable oscillator 64 can include a plurality of capacitors in parallel with a capacitance of the variable oscillator 64. The plurality of capacitors can have any suitable capacitance for generating an output with a desired frequency. In some implementations, the capacitance of each capacitor can be a multiple of another capacitor. For example, as illustrated in FIG. 8, each capacitor has a capacitance that is twice the capacitance of another capacitor. Such capacitance values can allow each capacitor to adjust the frequency by a different amount. Each of the capacitors can be electrically coupled/decoupled from the capacitance of the variable oscillator 64 via closing/opening a switch. The switch can be any suitable voltage controlled switch, for example, a transistor. Each switch can be controlled by one bit of the output from the dithering circuit 62.

Adding additional capacitors in parallel can increase the capacitance. With more capacitance, a resonant frequency of the variable oscillator can decrease. Conversely, with less capacitance, the resonant frequency of the variable oscillator can increase. Thus, the output frequency of the variable oscillator 64 can be adjusted based on which switches are closed and/or opened. For instance, the capacitor with a capacitance of 8C can adjust the output frequency of the variable oscillator 64 more than the capacitor with a capacitance of C. In some implementations, the variable oscillator may include an LC tank.

Figure 9:
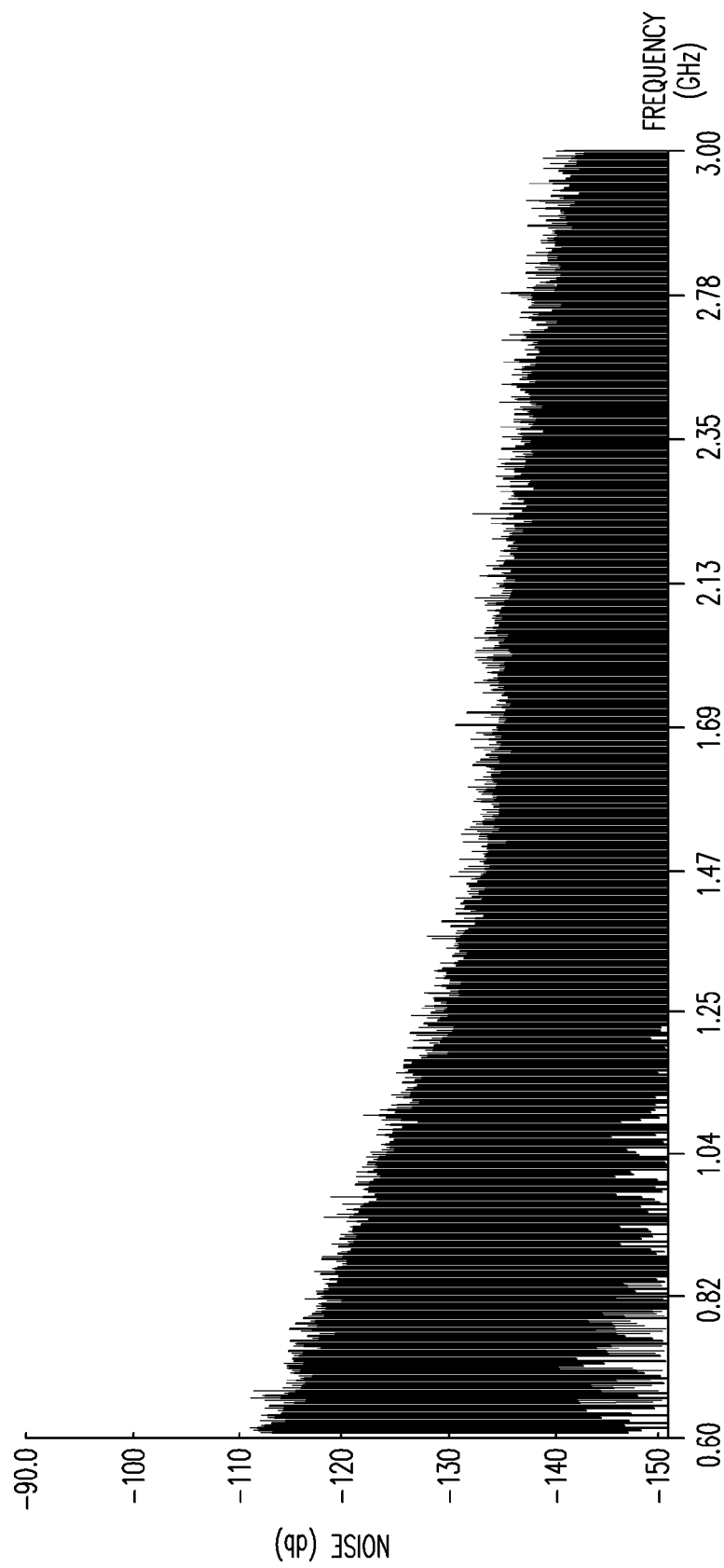
FIG. 9 graphically illustrates a frequency response of a variable oscillator according to an embodiment.

FIG. 9 graphically illustrates noise in a frequency response of an RF signal generated using a variable oscillator 64 dynamically controlled by a dithering circuit 62. As illustrated in FIG. 9, simulation results show that controlling the frequency of the variable oscillator 64 with a pseudo-random bit stream generated by the dithering circuit 62 can splatter and/or spread energy of the spurious tones on the RF signal. Unlike the frequency response in FIG. 5, lobes are not pronounced because the spurious tones are randomized through the frequency domain. In addition, the frequency response of FIG. 9 shows a lower noise floor. The noise of the frequency response illustrated in FIG. 9 is lower compared to the frequency response shown in FIG. 5. For example, noise is under −130 dB for a large portion of the RF frequency band.

Referring back to FIG. 6, the output Q of the variable frequency circuit 61 can be buffered by the buffer 66 and provided to the charge pump 68. In some implementations, the buffer 66 can provide the charge pump 68 with differential signals Qp and Qn. The charge pump 68 can generate a lower or higher voltage power source via direct current (DC) to DC voltage conversion. The charge pump 68 can generate a negative voltage based on the output of the variable frequency circuit 61. The output of the variable frequency circuit 61 can control a voltage level and/or switching time in the charge pump 68. The charge pump 68 can use one or more capacitors to store charge and one or more capacitors to hold charge and filter output voltage. This can create either a higher or lower voltage output. One or more switching elements can control connections to the storage capacitor(s). To generate a higher voltage, charge can be stored in a storage capacitor by applying a positive voltage across the storage capacitor. Then the storage capacitor can be disconnected from the positive voltage and reconnected with a negative terminal being connected to the positive voltage. This can roughly double a voltage across the storage capacitor. These principles can be applied to generate a negative voltage with the voltage generator 60a.

Figure 10:
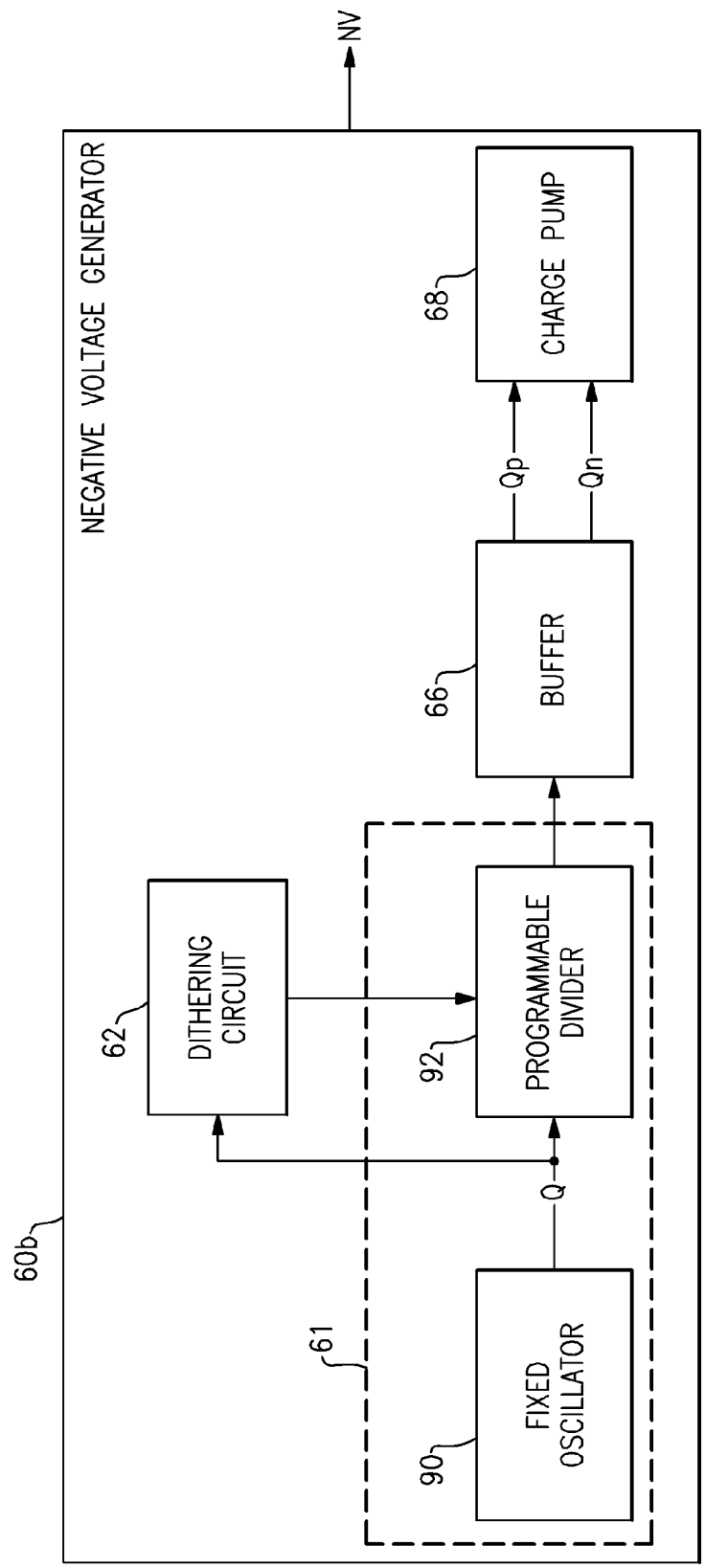
FIG. 10 schematically illustrates another embodiment of a negative voltage generator.

Referring to FIG. 10, another illustrative voltage generator 60b will be described. The voltage generator 60b is an alternative implementation of the voltage generator 60a, which can also be used in any application with a need for a negative voltage. The voltage generator 60b can include a dithering circuit 62 and a charge pump 68 with any combination of features described herein. However, the variable frequency circuit 61 is different in the negative voltage generator 60b compared to the negative voltage generator 60a. The variable frequency circuit 61 of the negative voltage generator 60b can include a fixed oscillator 90, a buffer 66, and a programmable divider 92. The fixed oscillator 90 can generate an output with a fixed frequency. The fixed frequency output can be provided to the programmable divider 92. The programmable divider 92 can divide the frequency of the fixed oscillator based on the output of the dithering circuit 62. In this way, the programmable divider 92 can vary the frequency of one or more output signals, which can control the charge pump 68. The one or more output signals can be buffered by the buffer 66. The buffer 66 can generate differential signals Qp and Qn that can control the charge pump 68 based on the one or more output signals of the programmable divider 92. Accordingly, the pseudo-random bit stream generated by the dithering circuit 62 can cause the programmable divider 92 to randomize spurious tones through the frequency domain and lower a harmonic noise floor.

Figure 11:
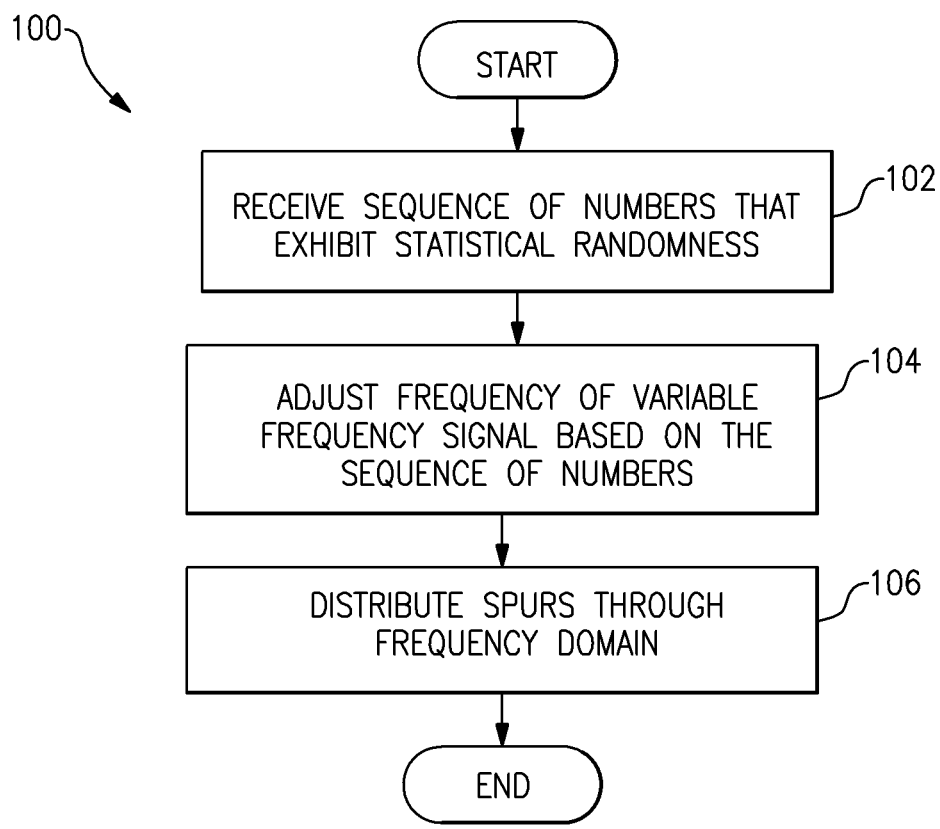
FIG. 11 is a flowchart of an illustrative method of distributing spurious tones in the frequency domain, according to an embodiment.

FIG. 11 is a flowchart of an illustrative method 100 of distributing spurious tones in the frequency domain, according to an embodiment. Any combination of the features of the method 100 may be embodied in a non-transitory computer readable medium and stored in memory. When executed, the non-transitory computer readable medium may cause some or all of the method 100 to be performed. It will be understood that the method 100 may include greater or fewer operations and the operations may be performed in any order, as appropriate.

The method 100 can distribute spurious tones through the frequency domain. This can reduce spurious tones at certain harmonics by spreading energy of the spurious tones through the frequency domain of a signal. A sequence of numbers exhibiting statistical randomness can be received at block 102. The sequence of numbers can be generated randomly or pseudo-randomly. Using the sequence of numbers, a frequency of a variable frequency circuit can be adjusted at block 104. By adjusting the frequency, spurious tones introduced by the variable frequency circuit (for example, an oscillator) can be distributed though the frequency domain of the signal at block 106. In this way, unwanted noise from spurious tones created by the by an oscillator can be reduced. According to certain implementations, the signal can be an RF signal. In some implementations, a negative voltage can be generated based on the signal. However, it will be understood that method 100 can be implemented in a variety of contexts.

Figure 12:
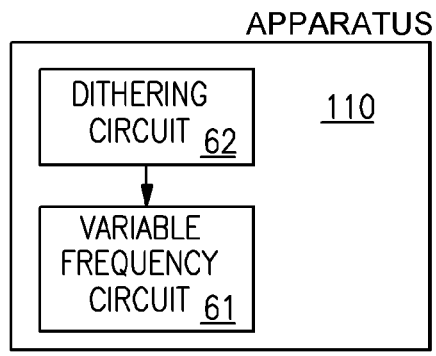
FIG. 12 is a block diagram of an apparatus according to an embodiment.

Any combination of the principles and advantages described herein can be implemented in a variety of applications. For instance, the variable frequency circuits 61 and the dithering circuits 62 described herein can be implemented in a wide variety of apparatus. FIG. 12 is a block diagram of an apparatus 110 according to an embodiment. As illustrated, the apparatus 110 includes a variable frequency circuit 61 and a dithering circuit 62. The dithering circuit 62 can generate a sequence of numbers that exhibit statistical randomness. The dithering circuit 62 can also implement any combination of features of the dithering circuits described herein. The variable frequency circuit 61 can adjust a frequency of an output based on the sequence of numbers generated by the dithering circuit 62 so as to spread energy of spurious tones in a frequency response of the output to lower a noise floor. The variable frequency circuit 61 can also implement any combination of features of the variable frequency circuits described herein.

Figure 13A:
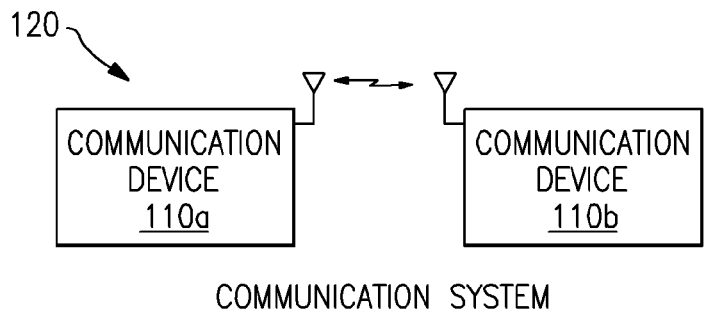
FIGS. 13A-13C illustrate example applications for one or more aspects of this disclosure.
Figure 13B:
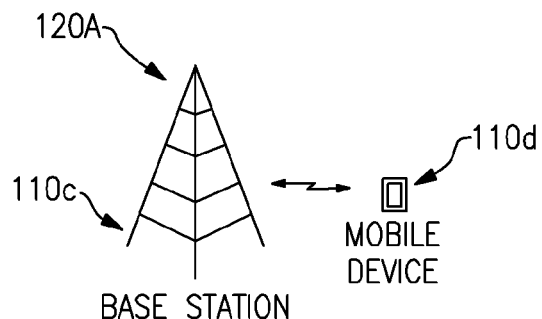
Figure 13C:
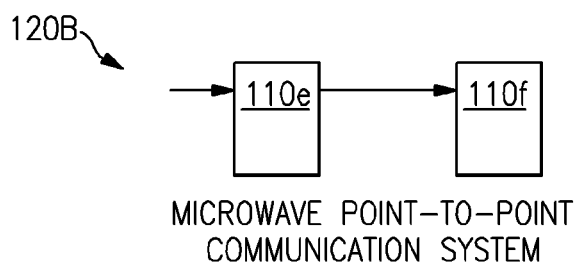

FIGS. 13A-13C illustrate example applications for one or more aspects of this disclosure. Generally described, aspects of this disclosure can be implemented in communications systems and, in particular, communications systems that include high isolation switches. For example, negative voltages generated as described herein can be used to slam a high isolation switch in the off position. It will be understood that aspects of this disclosure can be implemented in transmitters, receivers, transceivers, or any combination thereof.

In such applications, apparatus, methods, and integrated circuits described herein can be implemented to reduce noise and, in some instances, noise associated with RF signals that are transmitted and/or received. FIGS. 13A-13C depict some illustrative apparatus 110 in communication systems including communications devices 110a and 110b, a base station 110c, a mobile device 110d, and microwave point-to-point communications devices 110e and 110f.

As shown in FIG. 13A, an illustrative communication system 120 can include communications devices 110a and 110b that communicate with each other via antennas. In some implementations, the communication system 120 can be an RF communication system. The communication system 120 can be configured to communicate using, for example, Wi-Fi (IEEE 802.11), Bluetooth, Global System for Mobile (GSM), code division multiple access (CDMA), 3G, 4G, long term evolution (LTE), the like, or any combination thereof. The communications devices 110a and/or 110b can include the variable frequency circuit 61, the dithering circuit 62, the electronic system 10 of FIG. 1, or any combination thereof. The variable frequency circuit 61 and the dithering circuit 62 can reduce noise associated with signals, such as RF signals, in the communications devices 110a and 110b.

FIG. 13B illustrates a communication system 120a that includes a base station 110c in communication with a mobile device 110d. The base station 110c can implement any combination of features of the dithering circuit 62 and/or the variable frequency circuit 62 described herein. As mentioned above, the electronic system 10 can be embodied in a base station 110c. For instance, the dithering circuit 62 and the variable frequency circuit 61 can be implemented in the base station 110c to reduce noise. Alternatively or additionally, the mobile device 110d can include any combination of features of the electronic system 10 described herein, such as the dithering circuit 62 and the variable frequency circuit 61. For instance, the dithering circuit 62 and the variable frequency circuit 61 can be implemented in the mobile device 110d to reduce noise associated with at least one of a received signal and a transmitted signal. In some implementations, the dithering circuit 62 and/or the variable frequency circuit 61 can be embodied in a power amplifier module or other front end module of the mobile device 110d. Some example mobile devices 110d include, but are not limited to, a cellular phone (for example, a smart phone), a laptop, a tablet computer, a personal digital assistant (PDA), an electronic book reader, and a portable digital media player.

FIG. 13C illustrates a microwave point-to-point communication system 120b that can include microwave communications devices 110e and 110f. The microwave communications devices 110e and 110f can implement any suitable transmit and/or receive functionality associated with microwave communications. The microwave communications devices 110e and/or 110f can implement any combination of features of the dithering circuit 62 and/or the variable frequency circuit 61 described herein. In the microwave point-to-point communication system 120b, the dithering circuit 62 and the variable frequency circuit 61 can reduce noise.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The words "coupled" or connected", as generally used herein, refer to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

The above detailed description of certain embodiments is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the disclosure provided herein can be applied to other systems, not necessarily the systems described above. The elements and acts of the various embodiments described above can be combined to provide further embodiments.

While certain embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. An apparatus comprising:
a controller including a variable frequency circuit configured to spread energy of spurious tones through a frequency domain of a variable frequency signal, the controller configured to generate a control signal based on the variable frequency signal;

an attenuator component in communication with the controller, the attenuator component configured to attenuate a radio frequency (RF) signal based on the control signal; and an amplifier configured to generate an RF output signal based on the attenuated RF signal, the amplifier, the controller, and the attenuator component being implemented on a single integrated circuit.

2. The apparatus of claim 1 wherein the controller includes a charge pump configured to generate a charge pump output based on the variable frequency signal, the control signal being based on the charge pump output.

3. An apparatus comprising:
a controller including a variable frequency circuit configured to spread energy of spurious tones through a frequency domain of a variable frequency signal, the controller being configured to generate a negative voltage based on the variable frequency signal and to generate a control signal based on the negative voltage; and
an attenuator component in communication with the controller, the attenuator component configured to attenuate a radio frequency (RF) signal based on the control signal.

4. The apparatus of claim 3 wherein the controller includes a level shifter configured to generate the control signal based on the negative voltage, the control signal being a differential signal.

5. The apparatus of claim 1 wherein the controller includes a dithering circuit in communication with the variable frequency circuit, the dithering circuit configured to generate an output sequence that exhibits statistical randomness.

6. The apparatus of claim 1 wherein the attenuator component is a digital step attenuator component.

7. The apparatus of claim 1 wherein the controller is a serial peripheral interface controller.

8. The apparatus of claim 3 further comprising an amplifier configured to generate an RF output signal based on the attenuated RF signal, and the amplifier, the controller, and the attenuator component being implemented on a single integrated circuit.

9. The apparatus of claim 1 further comprising either a low noise amplifier configured to provide the RF input signal to the attenuator component or a combiner configured to provide the RF input signal to the attenuator component.

10. An apparatus comprising a negative voltage generator configured to generate a negative voltage that is maintained below zero Volts, the negative voltage generator including a variable frequency circuit configured to generate an output having energy of spurious tones spread though the frequency domain, and the negative voltage generator including a charge pump in communication with the variable frequency circuit, the charge pump configured to generate the negative voltage based on the output of the variable frequency circuit.

11. The apparatus of claim 10 wherein the variable frequency circuit includes a variable oscillator.

12. The apparatus of claim 10 wherein the variable frequency circuit includes a fixed oscillator and a programmable divider.

13. The apparatus of claim 10 wherein the negative voltage generator further includes a buffer electrically coupled between the variable frequency circuit and the charge pump.

14. The apparatus of claim 10 further comprising a dithering circuit configured to provide an input sequence that exhibits statistical randomness to the variable frequency circuit.

15. The apparatus of claim 14 wherein a clock signal of the dithering circuit is based on the output of the variable frequency circuit.

16. An electronically-implemented method comprising:
distributing spurious tones through a frequency domain of a signal generated by a variable frequency circuit;
generating a negative voltage based on the signal generated by the variable frequency circuit; and
controlling attenuation of a radio frequency (RF) signal based on a differential signal that is generated using the negative voltage.

17. The method of claim 16 further comprising receiving an input sequence to the variable frequency circuit that exhibits statistical randomness, said distributing being based on the received input sequence.

18. The method of claim 17 further comprising generating the input sequence using a dithering circuit that includes a linear feedback shift register.

19. The method of claim 16 further comprising generating the differential signal based on an output word provided by control circuitry and the negative voltage.

20. The method of claim 19 further comprising generating the output word based on a serial bit stream received by the control circuitry.

* * * * *